(12) United States Patent
Anzai

(10) Patent No.: US 6,718,509 B2
(45) Date of Patent: Apr. 6, 2004

(54) ERROR BIT CORRECTING METHOD FOR USE IN TIME-DIVISION MULTIPLE ACCESS SYSTEM AND BIT CORRECTING CIRCUIT

(75) Inventor: Takeshi Anzai, Saitama (JP)

(73) Assignee: NEC Corporation, Tokyo (JP)

( * ) Notice: Subject to any disclaimer, the term of this patent is extended or adjusted under 35 U.S.C. 154(b) by 470 days.

(21) Appl. No.: 09/768,516

(22) Filed: Jan. 25, 2001

(65) Prior Publication Data

US 2001/0010088 A1 Jul. 26, 2001

(30) Foreign Application Priority Data

Jan. 26, 2000 (JP) ........................... 2000-016999

(51) Int. Cl.[7] .................. H03M 13/45; H03M 13/15
(52) U.S. Cl. ........................................ 714/782
(58) Field of Search ..................... 714/709, 782

(56) References Cited

U.S. PATENT DOCUMENTS 4,691,319 A * 9/1987 Bose et al. ............... 714/808
4,890,286 A * 12/1989 Hirose ..................... 714/782

FOREIGN PATENT DOCUMENTS

| JP | 5-48664 | 2/1993 | |
| JP | 7-123043 | 5/1995 | |
| JP | 7-231261 | 8/1995 | |
| JP | 8-265174 | 10/1996 | |
| JP | 10-276099 | 10/1998 | |
| JP | 11-252192 | 9/1999 | |
| JP | 11-275162 | 10/1999 | |
| JP | 2000-4171 | 1/2000 | |
| WO | PCT/US95/04074 | 10/1995 | |
| WO | WO 9528046 A1 * | 10/1995 | ............ H04K/1/00 |

OTHER PUBLICATIONS

Chase, D.; Class of algorithms for decoding block codes with channel measurement information; Information Theory, IEEE Transactions on, vol. 18 Issue: Jan. 1, 1972; pp. 170–182.*

* cited by examiner

Primary Examiner—R. Stephen Dildine
(74) Attorney, Agent, or Firm—Whitham, Curtis & Christofferson, PC

(57) ABSTRACT

In a correcting method, error bits of a data signal inputted via a radio channel are corrected in a time division multiple access system. At least one of a RSSI information and a phase error information is determined at every symbols when the data signal is received. It is judged whether or not the determined information falls within a range of a predetermined value indicating deterioration of a line quality. One bit outside the range is determined as an error bit. The error bit is reversed.

8 Claims, 7 Drawing Sheets

ERROR BIT CORRECTING METHOD FOR USE IN TIME-DIVISION MULTIPLE ACCESS SYSTEM AND BIT CORRECTING CIRCUIT

BACKGROUND OF THE INVENTION

This invention broadly relates to an error bit correcting method and an error bit correcting circuit for correcting an error bit of a data signal inputted via a radio channel for a time division multiple access (TDMA) system in a mobile communication system.

In particular, this invention relates to an error bit correcting method and an error bit correcting circuit which are capable of improving a line quality by improving an accuracy of an error correction when an error bit of a BCH (Bose-Chaudhari-Hocquenghem)-coded data signal is corrected by the use of a predetermined error correcting code.

In general, a data signal propagated via a radio channel often includes error bits such that the data signal is changed into an error data signal in comparison with a wire-channel communication system in a mobile communication system.

To this end, a BCH (Bose-Chaudhari-Hocquenghem) code is generally used in the propagated data signal. Herein, the BCH code is a typical cyclic code, and can comply with various error correcting abilities and code lengths.

Under this circumstance, the data signal is transmitted via an interleave so that an error correcting code (ECC) effectively serves.

Conventionally, the propagated BCH-coded data signal has been attached with a character (namely, a CRC character) for detecting an error for a single data signal at a transmitting side on the basis of a CRC (cyclic redundancy check code) system.

Further, the predetermined BCH error correcting code (hereinafter, referred to as a CK code) is inserted for each data line (series) during an interleaving process to constitute one block so as to correct an error bit at a receiving side.

More specifically, the BCH code error correction is first carried out at the receiving side. In this event, a bit correction is performed for one bit position calculated by the CK code at every data line.

Accordingly, the correction can be carried out in the case where the number of error bits is equal to one. However, the correction can not be performed when the number of error bits is two bits or more.

Further, after the error of the BCH code is corrected for each line, the error is detected by performing the CRC process for an entire block data.

In consequence, when the bit is not corrected by the BCH code error correction, a CRC error takes place by CRC error detection. As a result, this block data signal is discarded or removed.

Herein, this conventional operation will be explained with reference to FIGS. 1A and 1B.

For example, when an error code exists at a bit position D12 in a data line 101 after de-interleave as illustrated in FIG. 1A, the bit position D12 is calculated from the CK code and the data bit included in the line data 101.

Thereafter, the bit at the bit position D12 is reversed or turned over as indicated in an error bit position information 102.

Thereby, the error is corrected, and a flag is placed or arranged at a bit position D1. Thus, where only one error bit exists for each data line, a CRC calculated result after the error correction is conducted for all lines indicates "CRC error absence".

On the other hand, when the error codes exist at two bit positions D6 and D15 in a data line 111 after the de-interleaving as illustrated in FIG. 1B, a bit position D11 placed at an approximately intermediate portion between the two bit positions is calculated from the CK code and the data bit included in the data line 111 in the BCH code error correction.

Consequently, the bit positioned at the bit position D11 is reversed or turned over as indicated in an error bit position information 112, and a flag is arranged at a bit position D1. In this case, a final CRC calculated result represents "CRC error presence" because the error bit still remains.

When the line data includes two or more error bits in the above-mentioned time division multiple access system, the CRC calculated result inevitably represents "CRC error presence". In consequently, all block data signals are discarded or removed. As a result, the line quality is degraded.

This reason will be explained as follows.

Namely, when the data line includes only one error bit after the de-interleaving, the error can be accurately corrected.

By contrast, the data line includes two or more error bits, the error bit can not be accurately specified. In consequence, the error bit can not be corrected.

SUMMARY OF THE INVENTION

It is therefore an object of this invention to provide an error bit correcting method and an error bit correcting circuit which are capable of accurately correcting two or more error bits with respect to a BCH code error correction in a time division multiple access system.

In a correcting method according to this invention, error bits of a data signal inputted via a radio channel are corrected in a time division multiple access system.

First, at least one of a RSSI (radio signal strength indicator) information and a phase error information is determined at every symbol when the data signal is received.

Subsequently, it is judged whether or not the determined information falls within a range of a predetermined value indicating deterioration of a line quality.

Consequently, one bit outside the range is determined as an error bit.

Finally, the error bit is reversed.

Further, a BCH (Bose-Chaudhari-Hocquenghem) code error correction may be used in addition. In this event, a predetermined BCH error correction code is used for a BCH coded data signal in the BCH code error correction.

The BCH code error correction is carried out by using the predetermined error correction code after the bit correction is performed by determining the one bit outside the range as the error bit.

In a correcting method according to this invention, error bits of a BCH coded data signal are corrected in a time division multiple access system.

First, at least one of a RSSI information and a phase error information is determined at every symbol when the data signal is received.

Subsequently, an error of a BCH code is corrected by using a predetermined error correction code.

Next, the determined information is checked when a CRC (cyclic redundancy check code) error is detected in a predetermined CRC error detection.

Successively, it is judged whether or not the determined information falls within a range of a predetermined value indicating deterioration of a line quality.

In consequence, one bit outside the range is determined as an error bit.

Next, the error bit is reversed.

Finally, another error of the BCH code is corrected by using the predetermined error correction code.

In a correcting circuit, error bits of a data signal inputted via a radio channel are corrected in a time division multiple access system.

An information collecting portion determines a line quality at every symbol by using at least one of a RSSI information and a phase error information when the data signal is received.

An estimate bit correction portion judges whether or not the determined information falls within a range of a predetermined value indicating deterioration of the line quality, and determines one bit outside the range as an error bit, and reverses the error bit.

Further, a BCH error correction portion may correct an error of a BCH code by using a predetermined BCH error correction code for a BCH coded data signal.

With such a structure, the BCH error correction portion is given with a bit-corrected data signal by the estimate bit correction portion.

In a correcting circuit according to this invention, error bits of a BCH coded data signal are corrected in a time division multiple access system.

A BCH error correction portion corrects an error of a BCH code by using a predetermined error correction code.

An information collecting portion determines a line quality at every symbol using at least one of a RSSI information and a phase error information when the data signal is received.

An estimate bit correction portion judges whether or not the determined information falls within a range of a predetermined value indicating deterioration of the line quality, and determines one bit outside the range as an error bit, and reverses the error bit.

With this structure, the estimation bit correction portion supplies the corrected data signal into the BCH error correction portion.

As described above, when the error bits of the BCH coded data signal are corrected by using the predetermined BCH error correction code, the accuracy of the error correction is enhanced. In consequence, the line quality can be improved. This reason will be explained as follows.

It is assumed that one bit is outside the range of the predetermined value indicating the deterioration of the communication quality on the basis of at least one of the RSSI information and the phase error information with respect to the communication quality at every symbol obtained during receiving the data signal. This one bit is determined as the error bit, and is reversed. Thereby, the one bit error is corrected.

Successively, the error correction of one code is executed by using the predetermined BCH error correction code for the BCH coded data signal.

Consequently, two or more of error bits in the data line (series) formed by de-interleaving in the BCH coded data signal can be accurately corrected.

Conventionally, the block data signal having the data line including two or more of error bits has been discarded or removed.

By contrast, such error correction will become possible, and many data signals, which were discarded in conventional case, can be effectively utilized according to this invention.

DESCRIPTION OF PREFERRED EMBODIMENT

Figure 2:
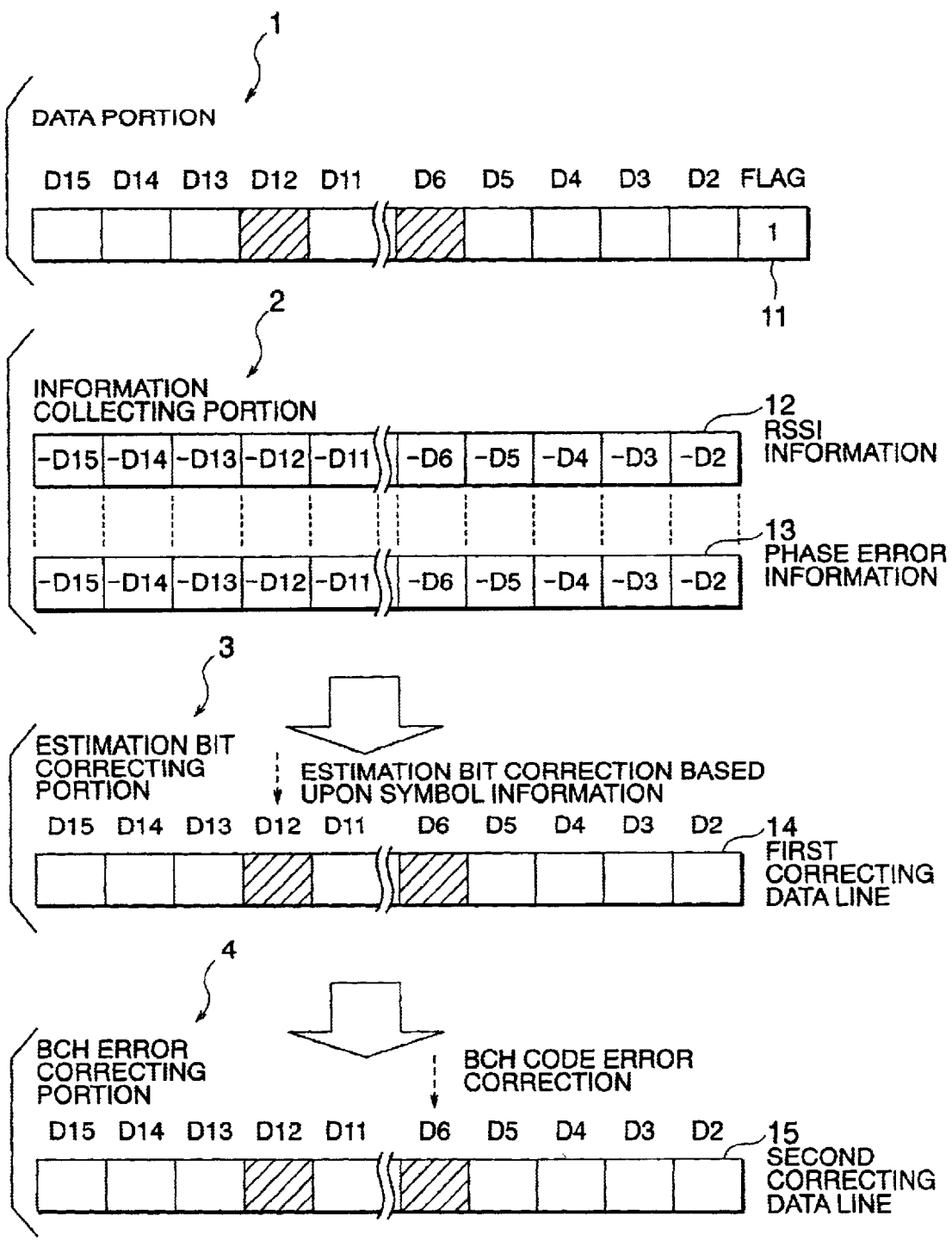
FIG. 2 is a functional explaining diagram showing an embodiment according to this invention.

Referring to FIG. 2, description will be made about an embodiment according to this invention.

In an error bit correcting circuit illustrated in FIG. 2, it is detected that a data line (series) 11 after developing by de-interleaving includes error bits by a CK code (BCH error correcting code) in a BCH (Bose-Chaudhari-Hocquenghem) coding system in a data portion 1, and a flag is arranged at a bit position D1. In this case, the error bits exist at two bit positions D6 and D12.

An information collecting portion 2 includes RSSI (radio signal strength indicator) information (RSSI-D15~-D2)12 due to RSSI values obtained for each symbol given from a radio channel and phase error information (-D15~-D2) 13, as symbol information.

An estimation bit correcting portion 3 judges whether or not the RSSI information and the phase error information fall within the predetermined value range indicating deterioration of a line quality based upon the symbol information of the information collecting portion 2.

Thereby, the estimation bit correcting portion 3 detects one bit D12 outside the predetermined value range, and estimates an error bit.

Further, the estimation bit correcting portion 3 corrects the error bit by reversing the estimation bit. Consequently, a first correcting data line 14 is formed so as to include the error bit only in the error bit position D6.

Subsequently, the first correcting data line 14 including one error bit is inputted into a BCH error correcting portion 4. Thereby, one bit position D6 is detected by the BCH error correction using the CK code, and this position is reversed.

Thereby, the error is corrected, and a second correcting data line 15 is completed.

As a result, two error bits can be accurately corrected for one data line. Accordingly, such possibility that a CRC (cyclic redundancy check code) calculating result indicates "CRC error absence" becomes higher, and a line quality can be enhanced.

In the above-mentioned error bit estimating method, a counting process is performed such that the estimating result improves a right answer rate on the basis of theory and experience.

The phase error information 13 is a data signal indicating an error of a phase difference generated between symbol rates. The phase difference can be detected by measuring time between the symbol rates by a demodulator.

More specifically, the phase difference between the symbol rates for the k-th and (k+1)-th symbols with respect to a phase modulation value $\Delta\Phi$ is represented by the following equation proportion to the phase modulation value $\Delta\Phi$.

$$D_{k+1}-D_k = n \times \Delta\Phi / 2\pi$$

Where n is resolution in symbol rate measurement.

The phase error information 13 is determined in dependence upon the difference between the phase difference calculated by the above-mentioned equation and an original phase difference between the symbol rates.

Consequently, it is assumed that there may be a correlation with the bit error of the receiving data signal because the phase error becomes large with the deterioration of the line quality in a radio transmission path.

Now, description will be made about an operation using the BCH error correction and the error correction due to the estimation bit with reference to FIGS. 2 through 4.

Figure 3:
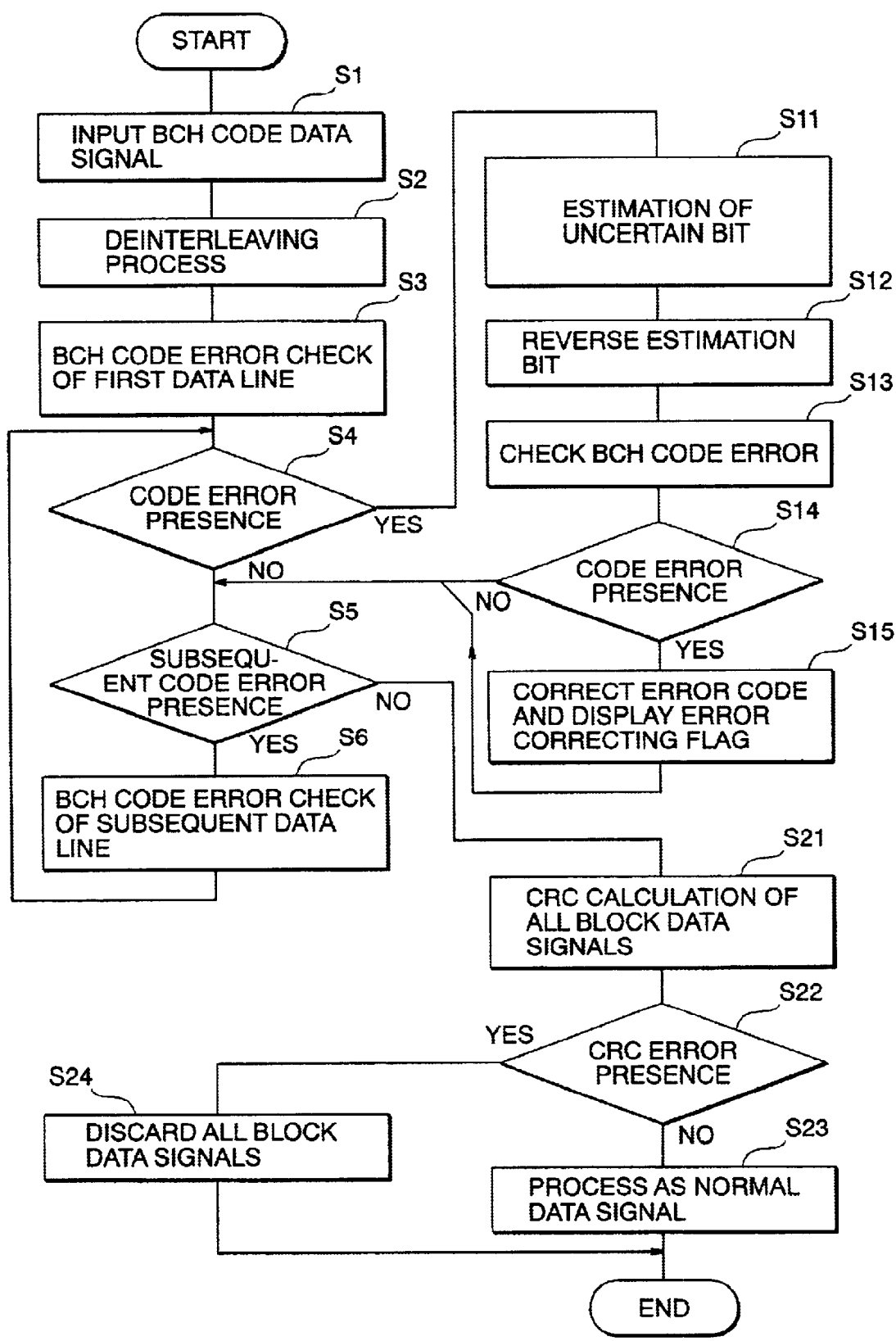
FIG. 3 is a flowchart showing a principal operation sequence according to this invention.
Figure 4:
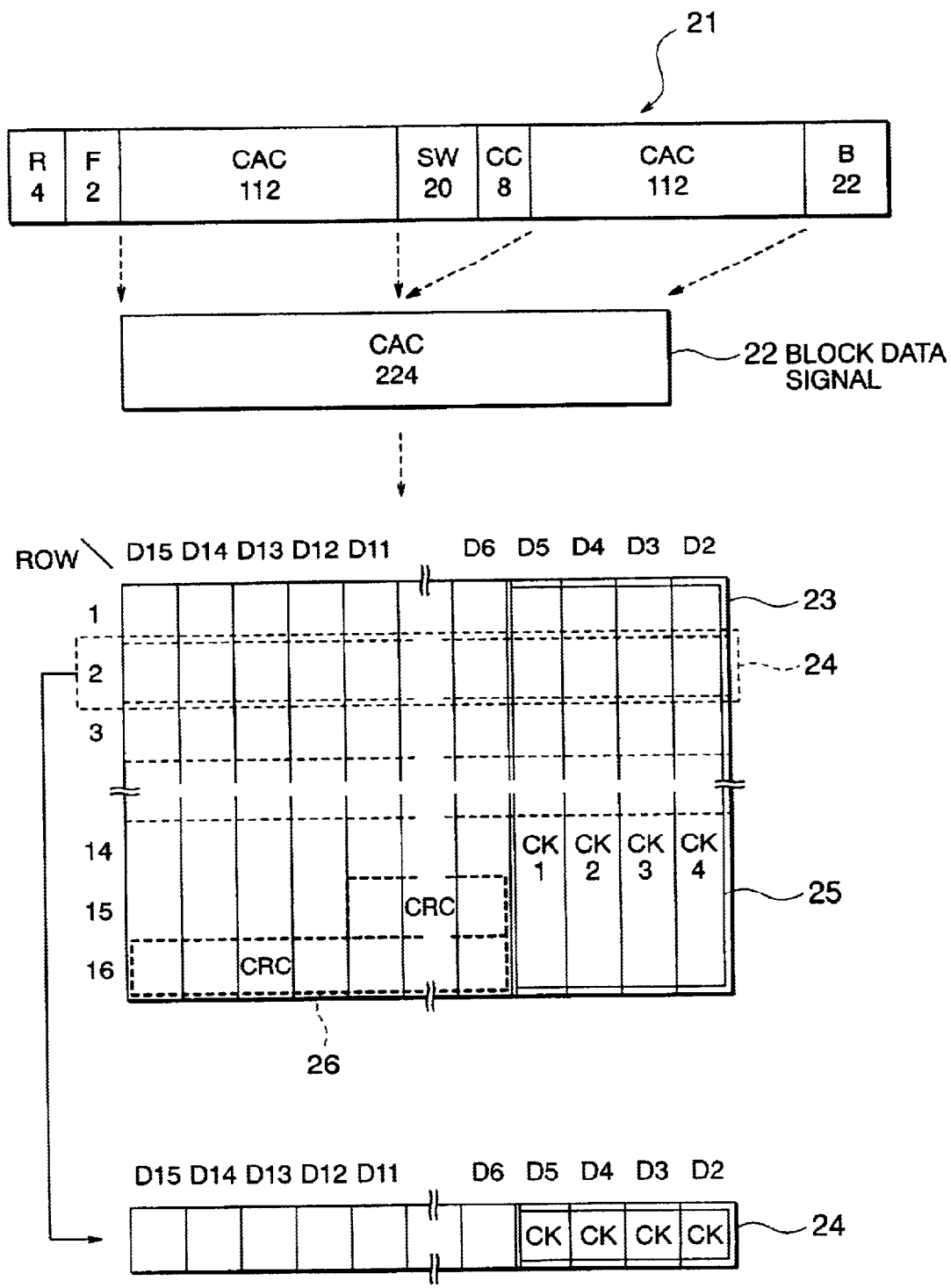
FIG. 4 is an explaining diagram showing a CAC (common access channel) data included in a transmitted data corresponding to a standard specification RCR-27H for a data line structure in an error correcting process according to this invention.

Herein, FIG. 3 shows a principal operation sequence while FIG. 4 shows an error correcting process when a CAC (common access channel) serial data signal is included in a transmission data signal corresponding to a standard specification RCR-27H (RCR: Research & Development Center for Radio System) of a digital system automobile telephone system.

The error bit correcting circuit inputs the BCH coding data signal (step S1). In this time, the error bit correcting circuit divides one slot 21 into lines as one block data 22, and rearranges into a data set 23 by the de-interleaving process (step S2).

The BCH coding error check of the first data line is carried out by the CK code included in the first data line (step S3).

In the case where "error code presence" is not detected (in case of "NO" in step S4), when the subsequent data line exists (in the case "YES" in step S5), the BCH code error check (S6) of the second data line is carried out (step S6).

Specifically, the sequence returns to the above step S4, and the sequence is repeated until a final 16-th data line.

In the case where the step S4 indicates "YES" and "code error presence", the sequence according to this invention will be executed.

More specifically, the corresponding RSSI information and the phase error information are checked from the information collecting portion 2, and one uncertain bit, for example, the bit of the bit position D12 is estimated as the error bit (step S11). Thereby, the estimation bit is reversed to execute the error correction (step S12).

Successively, the BCH code error check is executed (step S13) for this data line. In this event, when there is one error code (in the case "YES" in step S14), the error code is accurately calculated, for example, as the bit position D6 by the use of the data bit and the CK code.

Consequently, the error code is corrected by reversing the bit of the bit position D6, and the error correcting flag is arranged and displayed at the bit position D1 (step S15).

Where the step S14 indicates "NO", and judges as code error absence, or where the error correcting flag is arranged and displayed in the step S15, the subsequent sequence proceeds to the above step S5 for judging the presence or absence of the subsequent data line. Thereby, the additional sequence proposed according to this invention is completed.

In the case where the above step S5 indicates "NO", and there is no subsequent data line, the CRC calculation is carried out for the all data signals of this block (step S21), and the block data signal inputted by "CRC error absence" (in the case of "NO" in step S22) is processed as a normal data signal (step S23).

In the case of "CRC error presence" (in the case of "YES" in step S22), all of the inputted block data signals are discarded or removed (step S24), and the sequence is completed.

In the above-mentioned sequence, the BCH code error of the data line is first checked. In the case of "code error presence", the correction of the estimate bit and the error correction of the BCH code according to this invention have been sequentially carried out.

In such a sequence, it is assumed that the number of the error bits is equal to one. In this case, when the estimation bit is accurately corrected, "code error absence" appears in the error correcting sequence of the subsequent BCH code. In consequence, the efficiency of the error correction sequence can be realized.

In the meantime, when the line quality is excellent and the error is less, the steps S11 through S14 will be omitted, the sequence directly proceeds from the step S4 ("YES") to the step S15.

Thereby, in the case of "CRC error presence" (in the case of "YES" in the above step S22), only the data line displaying the error correcting flag is selected, and the sequences from the sequence S11 may be sequentially carried out.

In this event, the error code is first corrected by the BCH code error correction. Consequently, "code error absence" appears for the data line including only one error bit.

Figure 1A:
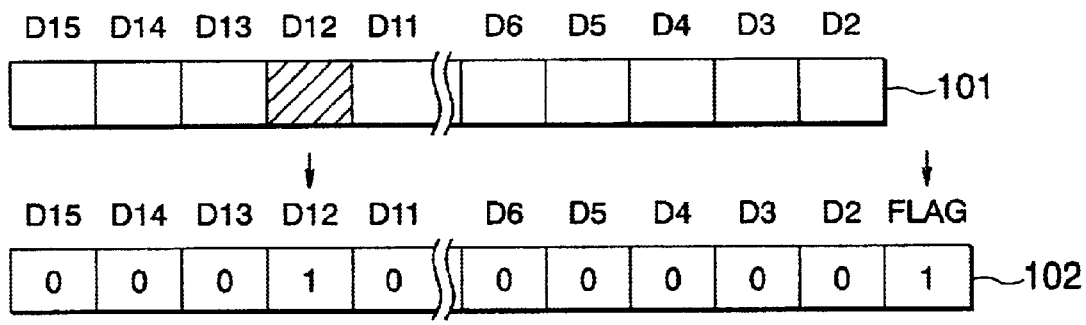
FIGS. 1A and 1B are functional explaining diagrams showing a conventional example.
Figure 1B:
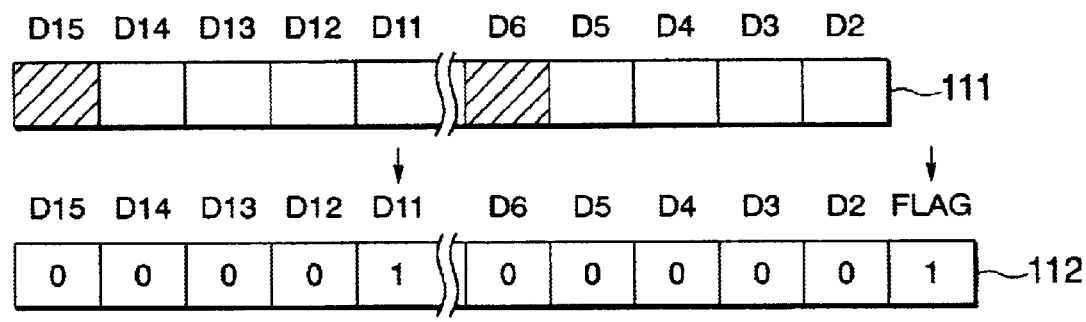

On the other hand, the number of the error bits are two or more, the uncertain code correction may be performed, as explained with reference to FIG. 1B.

It is therefore desirable to execute the sequence according to this invention after the correcting portion is restored for the data line including two or more of error bits in order to perform an accurate process.

Further, the correcting method due to the above-mentioned estimation bit can be independently used as a method for correcting the error bit of the data signal inputted via the radio channel.

Accordingly, the correcting code correction according to this invention may be not limited to the data signal due to the BCH code.

Moreover, either one of the RSSI information and the phase error information may be used to estimate the uncertain bit as the error bit.

The above-mentioned description has been made about the CAC serial data signal included in the transmitted data signal corresponding to the standard specification RCR-27H of the digital automobile telephone system.

However, this invention may be applicable for a data signal, such as, FACCH (fast access control channel), SACCH (slow access control channel), and RCH (housekeeping channel) with the improvement of the line quality other than the telephone system.

EXAMPLES

Referring to drawings, description will be made about examples with respect to each data signal of CAC (common access channel), FACCH (fast access control channel), SACCH (slow access control channel), and RCH (housekeeping channel) applicable in this invention.

Referring to FIG. 4, description will be made about the CAC data.

The CAC data signal included in one slot 21 has 224 bits to constitute one block data signal 22. The block data signal having 224 bits is a data set 23 arranged in 14 columns from a bit position D15 to D2 and 16 rows by de-interleaving, and is structured by 16 rows of row data signals 24.

4 columns of the bit positions D5–D2 correspond to a CK code 25 in each row data signal, and have 64 bits in total. Final 16 bits of the remaining data signals correspond to CRS characters 26 for CRC.

The correction of the estimate bit and the error correction of the error correction code of the BCH code are carried out for 10 bits every row data signal 24. After the error correction of all row data signals is completed, the error correction due to CRC will be executed.

Figure 5:
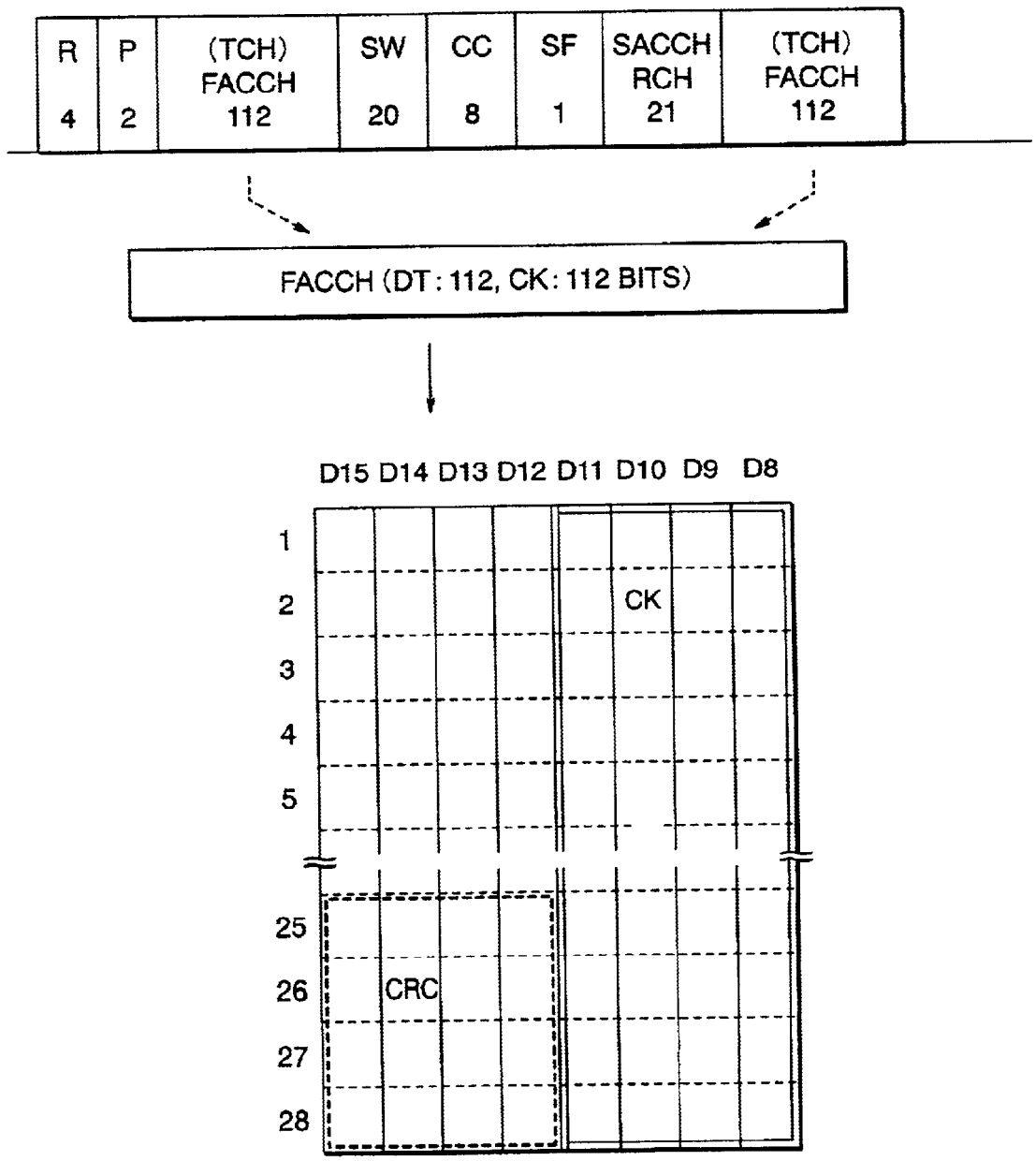
FIG. 5 is an explaining diagram showing a FACCH (fast access control channel) data signal included in a transmitted data signal corresponding to a standard specification RCR-27H for a data line structure used in an error correcting process according to this invention.

Referring to FIG. 5, description will be made about the FACCH data.

A block data signal of FACCH included in one slot has 224 bits. The CK code number of each row data signal is large to achieve the accuracy of the data signal.

Specifically, the 224 bits correspond to a data set arranged in 8 columns of bit positions D1 to D8 and 28 rows by de-interleaving, and are structured by row data signals of 28 rows.

4 columns of bit positions D11–D8 correspond to the CK codes in each row data signal, and have 112 bits in total. The remaining final 16 bits correspond to the CRC characters for CRC.

The correction of the estimate bit and the error correction of the error correction code of the BCH code are carried out for 4 bits at every row data signal. After the error correction of all row data signals is completed, the error correction due to CRC will be executed.

Figure 6:
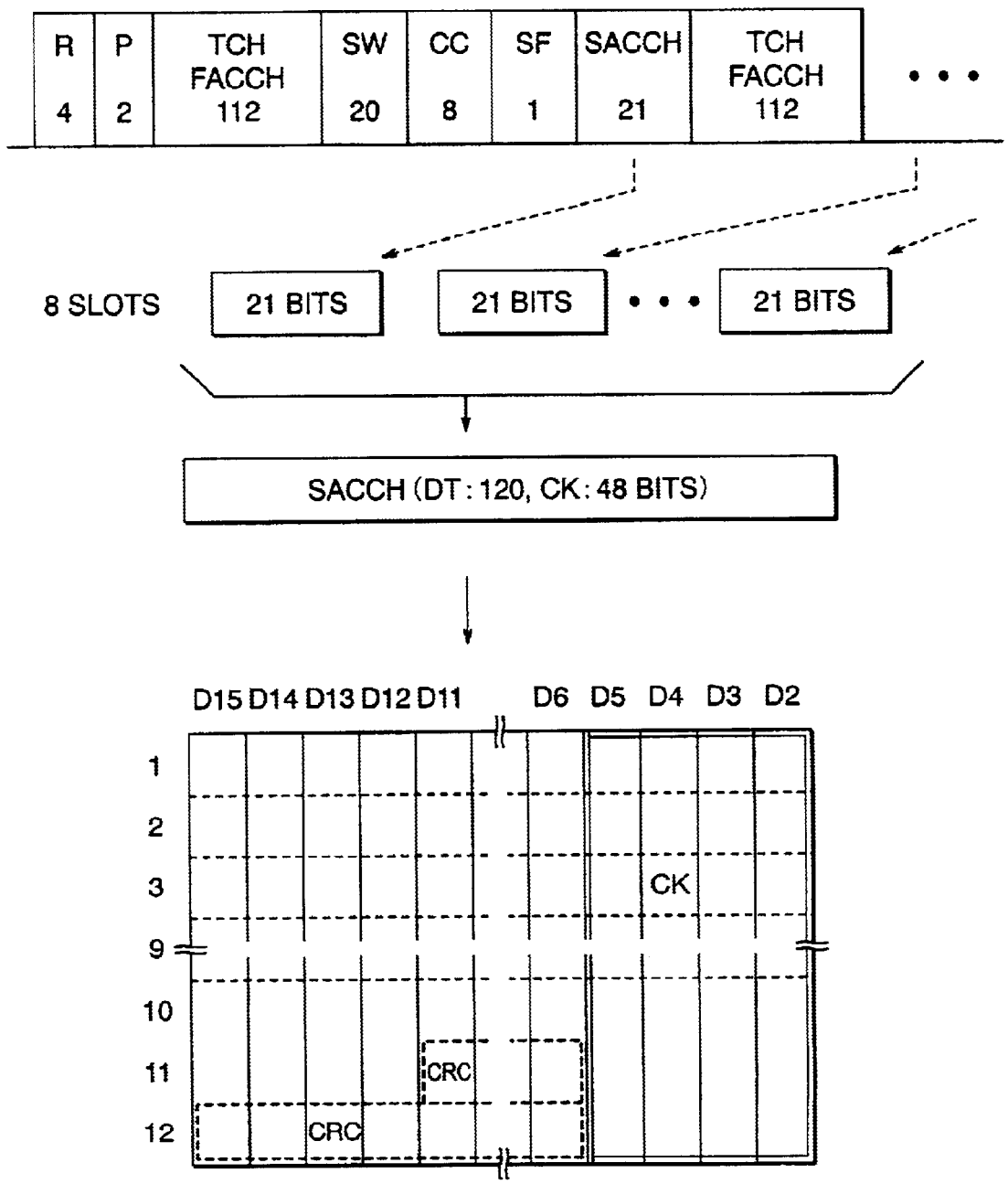
FIG. 6 is an explaining diagram showing a SACCH (slow access control channel) data signal included in a transmitted data signal corresponding to a standard specification RCR-27H for a data line structure used in an error correcting process according to this invention.

Referring to FIG. 6, description will be made about the SACCH data signal.

The SACCH data signal included one slot has 21 bits. The data signal is structured by a data set arranged in 14 columns from a bit position D15 to D2 and 12 rows, and row data signals of 12 rows by de-interleaving using 168 bits of 8 slots as one block data signal.

4 columns of the bit positions D5–D2 correspond to the CK code in each row data signal and have 48 bits in total. 16 bits of the remaining final data signal correspond to the CRC characters for CRC.

The correction of the estimate bit and the error correction of the error correction code of the BCH code are carried out for 10 bits every row data signal. After the error correction of all row data signals is completed, the error correction due to CRC will be executed.

Figure 7:
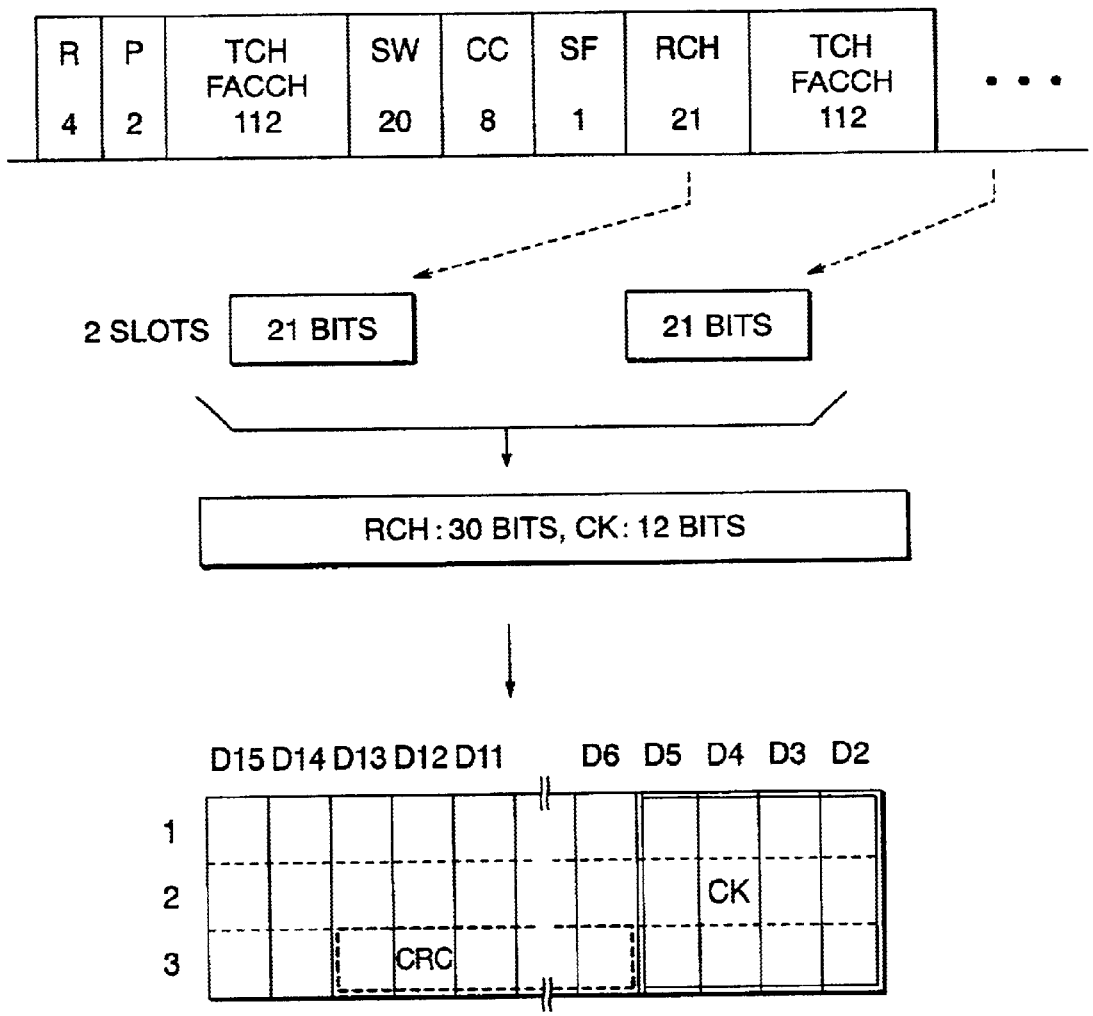
FIG. 7 is an explaining diagram showing a RCH data signal included in a transmitted data signal corresponding to a standard specification RCR-27H for a data line structure used in an error correcting process according to this invention.

Referring to FIG. 7, description will be made about the RCH data signal.

The SACCH data signal included one slot has 21 bits. The data signal is structured by a data set arranged in 14 columns from a bit position D15 to D2 and 3 rows, and row data signals of 3 rows by de-interleaving using 42 bits of 2 slots as one block data signal.

4 columns of the bit positions D5–D2 correspond to the CK code in each row data signal, and have 12 bits in total. 16 bits of the remaining final data signal correspond to the CRC characters for CRC.

The correction of the estimate bit and the error correction of the error correction code of the BCH code are carried out for 10 bits every row data signals. After the error correction of all row data signals is completed, the error correction due to CRC will be executed.

While this invention has been thus far been disclosed in conjunction with several embodiments thereof, it will be readily possible for those skilled in the art to put this invention into practice in various other manners.

What is claimed is:

1. A method of correcting error bits of a data signal inputted via a radio channel in a time division multiple access system, comprising the steps of:

checking for an error in a data line of said data signal using a check code of an error correction scheme;

determining at least one of a RSSI information and a phase error information at every symbol of said data line when the data signal is received;

judging whether or not the determined information falls within a range of a predetermined value indicating deterioration of a line quality;

determining one bit outside the range as an error bit;

reversing the error bit;

rechecking for error in said data line using said check code of said error correction scheme; and upon said rechecking error using said error correction scheme.

2. A method as claimed in claim 1, wherein said error correction scheme uses BCH encoding, and a predetermined BCH error correction code is used for a BCH coded data signal in the BCH code error correction.

3. A method as claimed in claim 2, wherein:

the BCH code error correction is carried out by using the predetermined error correction code after the bit correction is performed by determining as the error bit.

4. A method of correcting error bits of a BCH coded data signal in a time division multiple access system, comprising the steps of:

checking for an error in a data line of said data signal using a check code of an error correction scheme, said error correction scheme using BCH encoding;

determining at least one of a RSSI information and a phase error information at every symbol of said data line when the data signal is received;

correcting an error of a BCH code by using a predetermined error correction code;

checking the determined information when a CRC error is detected in a predetermined CRC error detection;

judging whether or not the determined information falls within a range of a predetermined value indicating deterioration of a line quality;

determining one bit outside the range as an error bit;

reversing the error bit; and correcting another error of the BCH code by using the predetermined error correction code.

5. A circuit for correcting error bits of a data signal inputted via a radio channel in a time division multiple access system, comprising:

an error checking portion using a check code of an error correction scheme to determine an error in a data line of said data signal;

an information collecting portion which determines a line quality at every symbol of said data line by using at least one of a RSSI information and a phase error information when the data signal is received; and an estimate bit correction portion which judges whether or not the determined information falls within a range of a predetermined value indicating deterioration of the line quality and which determines one bit outside the range as an error bit and which reverses the error bit; and an error correction portion which rechecks for error in said data line using said check code of said error correction scheme, and upon said rechecking error using said error correction scheme.

6. A circuit as claimed in claim 4, wherein said error correction scheme uses BCH encoding, and wherein said said error correction portion corrects an error of a BCH code by using a predetermined BCH error correction code for a BCH coded data signal.

7. A circuit as claimed in claim 6, wherein:

the error correction portion is given with a bit-corrected data signal by the estimate bit correction portion.

8. A circuit for correcting error bits of a BCH coded data signal in a time division multiple access system, comprising:

a BCH error checking portion using a predetermined error correction code to check for an error in a data line of said data signal;

a BCH error correction portion which corrects an error of a BCH code by using said predetermined error correction code;

an information collecting portion which determines a line quality at every symbol of said data line using at least one of a RSSI information and a phase error information when the data signal is received; and an estimate bit correction portion, responsive to said error checking portion, which judges whether or not the determined information falls within a range of a predetermined value indicating deterioration of the line quality and which determines one bit outside the range as an error bit and which reverses the error bit;

the estimation bit correction portion supplying the corrected data signal into the BCH error correction portion.

* * * * *